(12) United States Patent
Sakai et al.

(10) Patent No.: US 7,349,088 B2
(45) Date of Patent: Mar. 25, 2008

(54) PROCESS MONITORING SYSTEM, PROCESS MONITORING METHOD, AND METHOD FOR MANUFACTURING SEMICONDUCTOR DEVICE

(75) Inventors: Takayuki Sakai, Tokyo (JP);
Masanobu Kibe, Kanagawa (JP);
Tokuhisa Ohiwa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/882,275

(22) Filed: Jul. 31, 2007

(65) Prior Publication Data

US 2007/0273880 A1  Nov. 29, 2007

Related U.S. Application Data (63) Continuation of application No. 10/969,860, filed on Oct. 22, 2004.

(30) Foreign Application Priority Data

Oct. 22, 2003  (JP) .......................... P2003-362134

(51) Int. Cl.
*G01J 4/00* (2006.01)
(52) U.S. Cl. ....................................... 356/364; 356/369
(58) Field of Classification Search ................ 356/364, 356/365, 369; 250/225, 559.09
See application file for complete search history.

(56) References Cited

U.S. PATENT DOCUMENTS 5,408,322 A   4/1995  Hsu et al.
6,034,777 A * 3/2000  Johs et al. .................. 356/369

FOREIGN PATENT DOCUMENTS

JP   2002-93870    3/2002

OTHER PUBLICATIONS

U.S. Patent Application for Takayuki Sakai et al., U.S. Appl. No. 10/395,065, filed Mar. 25, 2003.

* cited by examiner

*Primary Examiner*—Roy M Punnoose
(74) *Attorney, Agent, or Firm*—Finnegan, Henderson, Farabow, Garrett & Dunner, L.L.P.

(57) ABSTRACT

A process monitoring system has a process chamber configured to hold an object to be processed, an illumination source configured to emit a light to the object, a polarizer configured to polarize the light, a monitor window having a birefringent material and provided on the process chamber to propagate the light, direction adjusting equipment configured to adjust a relationship between a polarization plane of the light and a direction of an optic axis of the monitor window, and a monitoring information processor configured to detect the light reflected from the object.

4 Claims, 13 Drawing Sheets

PROCESS MONITORING SYSTEM, PROCESS MONITORING METHOD, AND METHOD FOR MANUFACTURING SEMICONDUCTOR DEVICE

CROSS REFERENCE TO RELATED APPLICATIONS

This is a continuation of U.S. patent application Ser. No. 10/969,860, filed Oct. 22, 2004, which is incorporated in its entirety by reference. This application is also based upon and claims priority from prior Japanese Patent Application P2003-362134 filed on Oct. 22, 2003, the entire contents of which are incorporated by reference herein.

BACKGROUND OF THE INVENTION

1. Field of the Invention

The present invention relates to measurement techniques and in particular to a process monitoring system, a process monitoring method, and a method for manufacturing a semiconductor device.

2. Description of the Related Art

In semiconductor manufacturing process, a depth of an etched groove and a thickness of a deposited membrane are controlled by monitoring an etching time and a deposition time. However, such monitoring method cannot operate precisely when a process environment, such as temperature and pressure, is changed unexpectedly. The imprecise monitoring decreases the yield rate of the manufactured semiconductor devices. Therefore, process monitoring systems measuring the actual depth of the etched groove or the actual thickness of the deposited membrane has been recently introduced.

In Japanese Patent Laid-Open Publication No. 2002-93870, a process monitoring system is disclosed, in which an inspection light is irradiated on an object to be processed. The object is held in a process chamber. The light is irradiated through a monitor window provided in the process monitor. The disclosed system estimates the actual depth of the etched groove or the actual thickness of the deposited membrane on the object to be processed by detecting the reflected inspection light.

However, if the monitor window is composed of birefringent material and the inspection light is polarized, the monitor window interacts with the inspection light and modulates the phase of the light. Such phenomenon causes interference noises in a spectrum of the inspection light. Therefore, it is difficult to achieve a precise monitoring.

Also, an upper electrode is provided in the process chamber of plasma process. A plurality of nozzle holes is formed in the upper electrode in order to supply an interior of the process chamber with a reaction gas. However, if the monitor window is provided on the upper electrode, the monitor window disturbs a stable supply of the reaction gas since the monitor window does not include the nozzle holes. Therefore, the reaction gas concentration beneath the monitor window becomes less than in other space. Consequently, the evenness of an etching rate or deposition rate in the process chamber is decreased.

SUMMARY OF THE INVENTION

An aspect of present invention inheres in a process monitoring system according to an embodiment of the present invention. The system includes a process chamber configured to hold an object to be processed, an illumination source configured to emit a light to the object, a polarizer configured to polarize the light, a monitor window having a birefringent material and provided on the process chamber to propagate the light, direction adjusting equipment configured to adjust a relationship between a polarization plane of the light and a direction of an optic axis of the monitor window, and a monitoring information processor configured to detect the light reflected from the object.

Another aspect of the present invention inheres in a process monitoring system according to the embodiment of the present invention. The system includes a process chamber configured to hold an object to be processed, an illumination source configured to emit a light to the object, a monitor window provided on the process chamber to propagate the light, the monitor window having a plurality of nozzle holes, the diameter of the nozzle holes being smaller than a beam diameter of the light in the monitor window, and a monitoring information processor configured to detect the light reflected from the object.

Yet another aspect of the present invention inheres in a process monitoring method according to the embodiment of the present invention. The method includes i inserting an object to be processed into a process chamber, the process chamber having a monitor window containing a birefringent material, irradiating a light to the object through the monitor window, polarizing the light, adjusting a relationship between a polarization plane of the light and a direction of an optic axis of the monitor window, and detecting the light reflected from the object.

Yet another aspect of the present invention inheres in a process monitoring method according to the embodiment of the present invention. The method includes inserting an object to be processed into a process chamber, the process chamber having a monitor window, irradiating a light to the object through the monitor window, focusing the light so that a beam diameter of the light in the monitor window is larger than each diameter of a plurality of nozzles hole formed in the monitor window, and detecting the light reflected from the object.

Yet another aspect of the present invention inheres in a method for manufacturing a semiconductor device according to the embodiment of the present invention. The manufacturing method includes forming an insulating film above a semiconductor substrate, arranging an etching mask on the insulating film, inserting the semiconductor substrate into a process chamber, the process chamber having a monitor window containing a birefringent material, irradiating a polarized light to a surface of the semiconductor substrate through the monitor window, adjusting a relationship between a polarization plane of the light and a direction of an optic axis of the monitor window, etching the insulating film in the process chamber, monitoring an end point of the etching by detecting the light reflected from the semiconductor substrate having the insulating film thereabove, and stopping the etching.

Yet another aspect of the present invention inheres in a method for manufacturing a semiconductor device according to the embodiment of the present invention. The manufacturing method includes forming an insulating film above a semiconductor substrate, arranging an etching mask on the insulating film, inserting the semiconductor substrate into a process chamber, the process chamber having a monitor window, focusing a light so that a beam diameter of the light in the monitor window is larger than each diameter of a plurality of nozzle holes formed in the monitor window, supplying a reaction gas into the process chamber through the nozzle holes, etching the insulating film in the process chamber, monitoring an end point of the etching by detecting the light reflected from the semiconductor substrate having the insulating film thereabove, and stopping the etching.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 1:
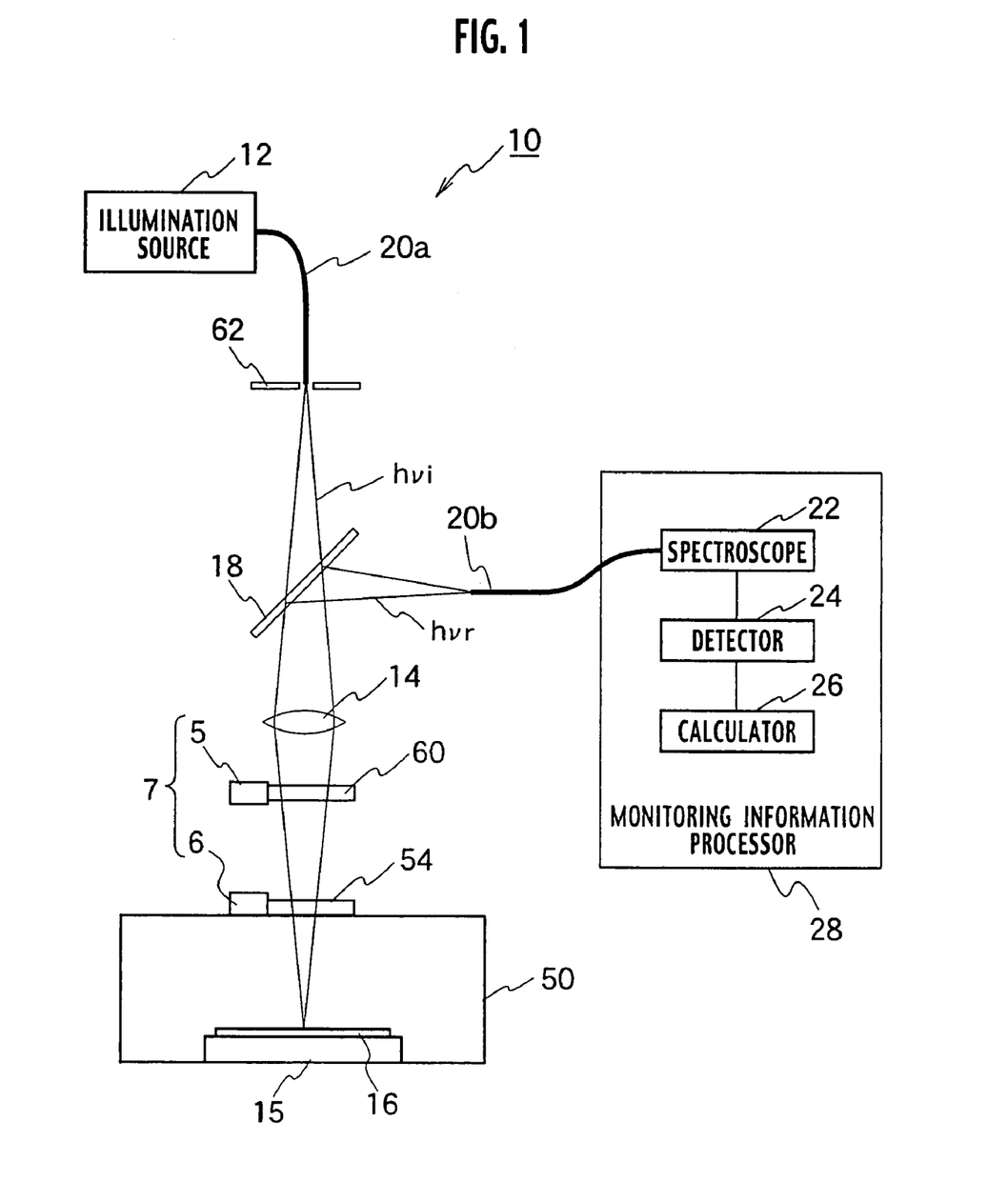
FIG. 1 is a diagram of a process monitoring system of plasma process in accordance with a first embodiment of the present invention.

With reference to FIG. 1, a process monitoring system 10 of plasma process according to a first embodiment of the present invention has a process chamber 50 of plasma process configured to hold an object 16 to be processed, an illumination source 12 configured to emit an inspection light $h\gamma_i$ to the object 16, a polarizer 60 configured to polarize the inspection light $h\gamma_i$, a monitor window 54 containing a birefringent material and provided on the process chamber 50 of the plasma process to propagate the inspection light $h\gamma_i$, direction adjusting equipment 7 configured to adjust a relationship between a polarization plane "P" of the inspection light $h\gamma_i$ and a direction of an optic axis "A" of the monitor window 54, and a monitoring information processor 28 configured to detect reflected inspection light $h\gamma_i$ reflected from the object 16, which is to be processed.

The inspection light $h\gamma_i$ emitted from the illumination source 12 is propagated through an optical fiber 20a. Spatial noise of the inspection light $h\gamma_i$ is eliminated by a spatial filter 62. The inspection light $h\gamma_i$ propagates through a beam splitter 18 and is condensed by a lens 14.

The oscillation of the linearly polarized inspection light $h\gamma_i$ is confined to a polarization direction "E" perpendicular to the propagation direction by the polarizer 60. A rotator 5 is configured to rotate the polarizer 60 to define the polarization direction "E" of the oscillation.

The monitor window 54 is provided in an upper portion of the process chamber 50 of the plasma process. A direction adjuster 6 is attached to the monitor window 54. The direction adjuster 6 is configured to adjust the optic axis "A" direction of the monitor window 54. The details of the optic axis "A" will be described below. A z-axis goniometer and a rotation stage may be used for the direction adjuster 6. The direction adjuster 6 and the rotator 5 implement a direction adjusting equipment 7.

A substrate holder 15 is disposed in the process chamber 50 of the plasma process. The substrate holder 15 is configured to hold the object 16. The inspection light $h\gamma_i$ is focused on the surface of the object 16 through the monitor window 54. A turntable that can rotate the object 16 is available as the substrate holder 15. Therefore, it is possible to adjust the relationship between the polarization direction "E" of the oscillation of the inspection light $h\gamma_i$ and an orientation of the disposed object 16 with the direction adjusting equipment 7 and the substrate holder 15.

A reflected light $h\gamma_r$ from the surface of the object 16 to be processed is transmitted to the monitoring information processor 28 through the monitor window 54, the polarizer 60, the lens 14, the beam splitter 18, and an optical fiber 20b.

The monitoring information processor 28 analyzes a reflection light $h\gamma_r$ of the inspection light $h\gamma_i$. The monitoring information processor 28 has a spectroscope 22, a detector 24, and a calculator 26. The spectroscope 22 observes a spectrum of the reflected light $h\gamma_r$. The detector 24 detects the light intensity of the reflected light $h\gamma_r$ at each wavelength. The calculator 26 calculates information on the thickness direction of the object 16 from the light intensity. Information about the thickness of a thin film and the depth of an etched groove is an example of the "information on the thickness direction of the object 16".

Figure 2:
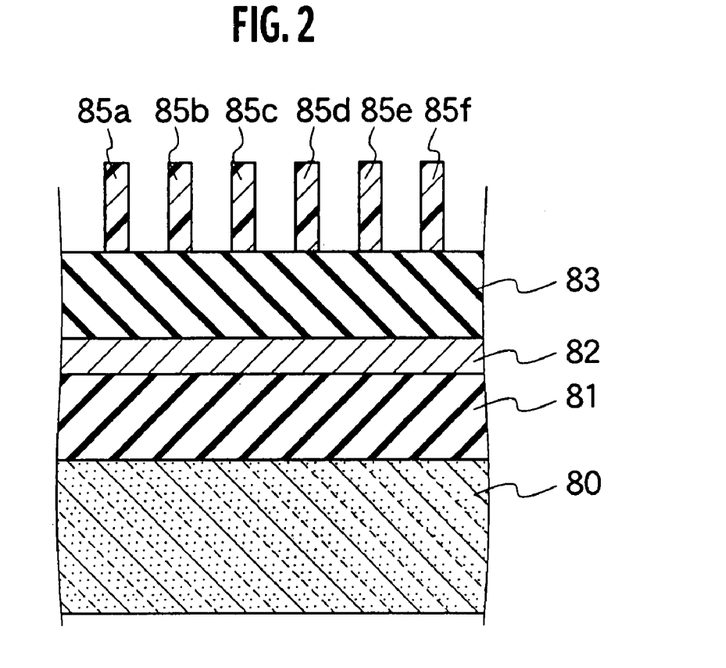
FIG. 2 is a sectional view of a measuring object in accordance with the first embodiment of the present invention.
Figure 3:
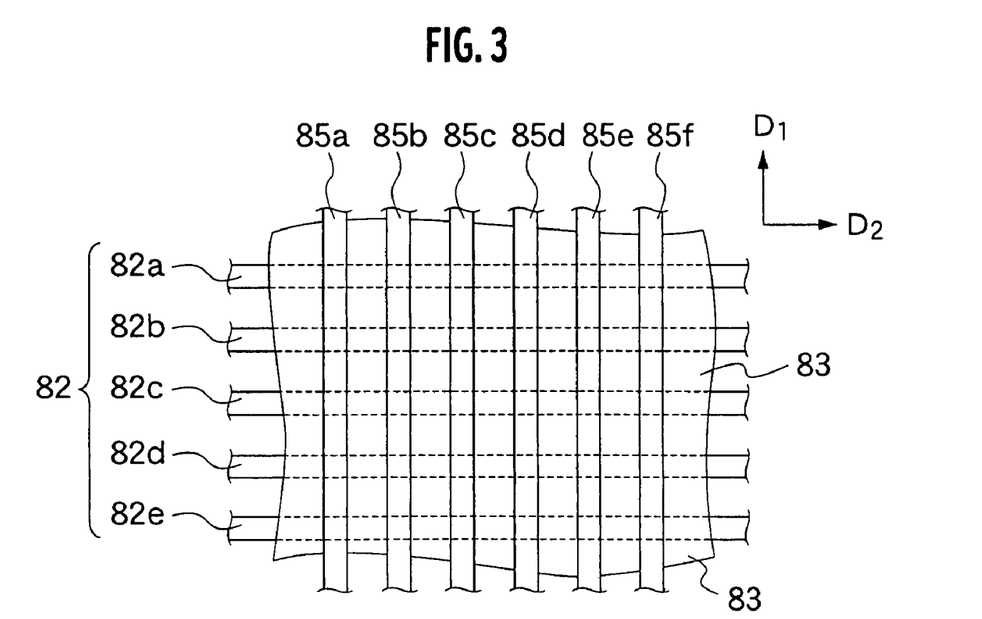
FIG. 3 is a plan view of the measuring object in accordance with the first embodiment of the present invention.

An example of the object 16 is shown in FIG. 2. The object 16, to be processed, has a semiconductor substrate 80, a first insulating film 81 disposed on the semiconductor substrate 80, a first circuit layer 82 disposed on the first insulating film 81, second insulating film 83 disposed on the first circuit layer 82, and a plurality of resist masks 85a, 85b, 85c, 85d, 85e, 85f disposed on the second insulating film 83. The plurality of resist masks 85a-85f are arranged in parallel with a direction "D$_1$" as shown in FIG. 3. In the first circuit layer 82, a plurality of wires 82a, 82b, 82c, 82d, 82e are arranged in parallel with a direction "D$_2$". The direction "D$_2$" is perpendicular to the direction "D$_1$".

With reference again to FIG. 1, the rotator 5 and the polarizer 60 confines the polarization direction "E" of the oscillation of the inspection light h$\gamma_i$ to the direction "D$_2$" shown in FIG. 3. In this case, the inspection light h$\gamma_i$ cannot penetrate the first circuit layer 82 and is reflected from the first circuit layer 82. Therefore, it is possible to eliminate the influence on the inspection light h$\gamma_i$ caused by layers beneath the first circuit layer 82.

Figure 4:
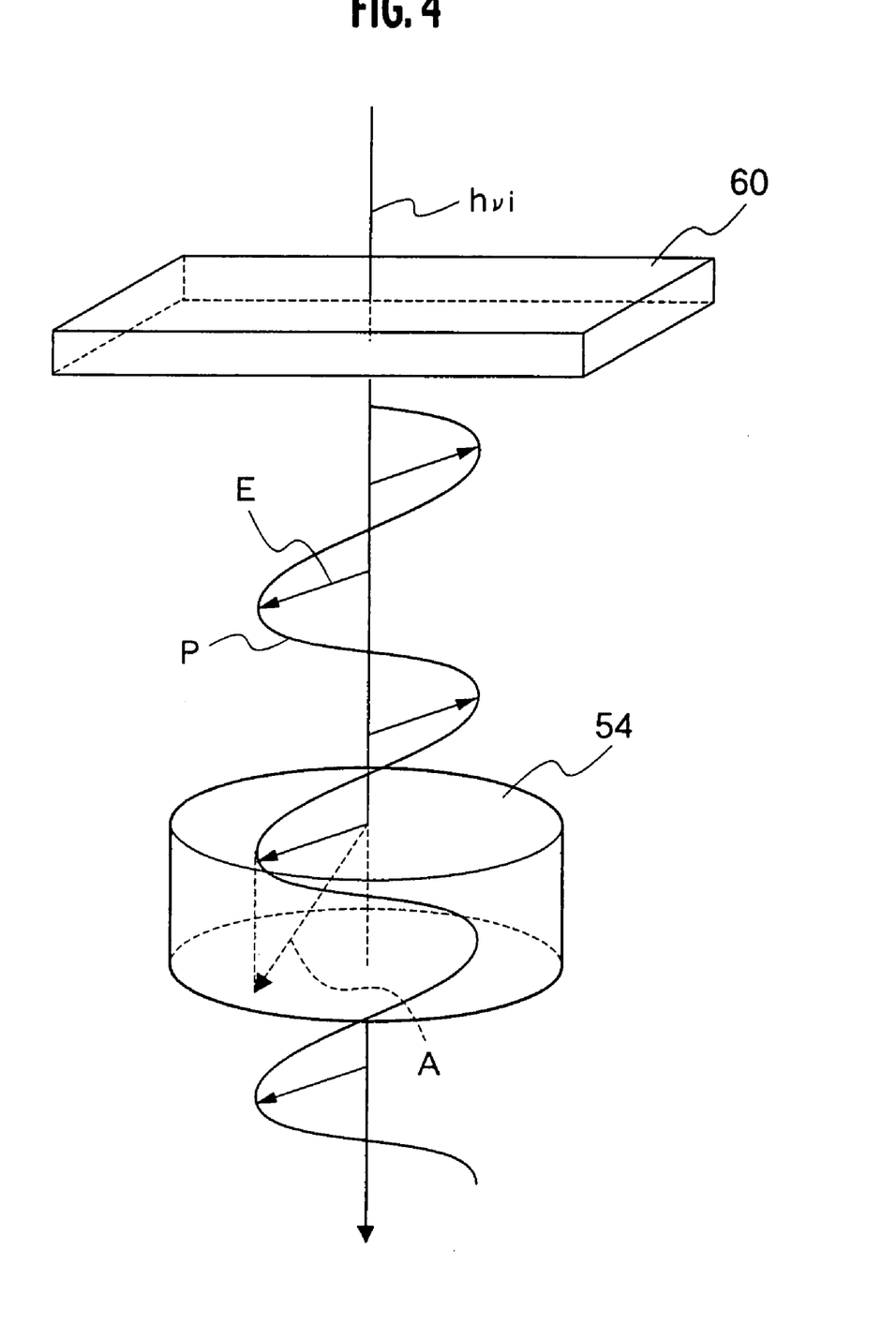
FIG. 4 is a first exploded perspective view of a polarizer and a monitor window in an optical system in accordance with the first embodiment of the present invention.
Figure 5:
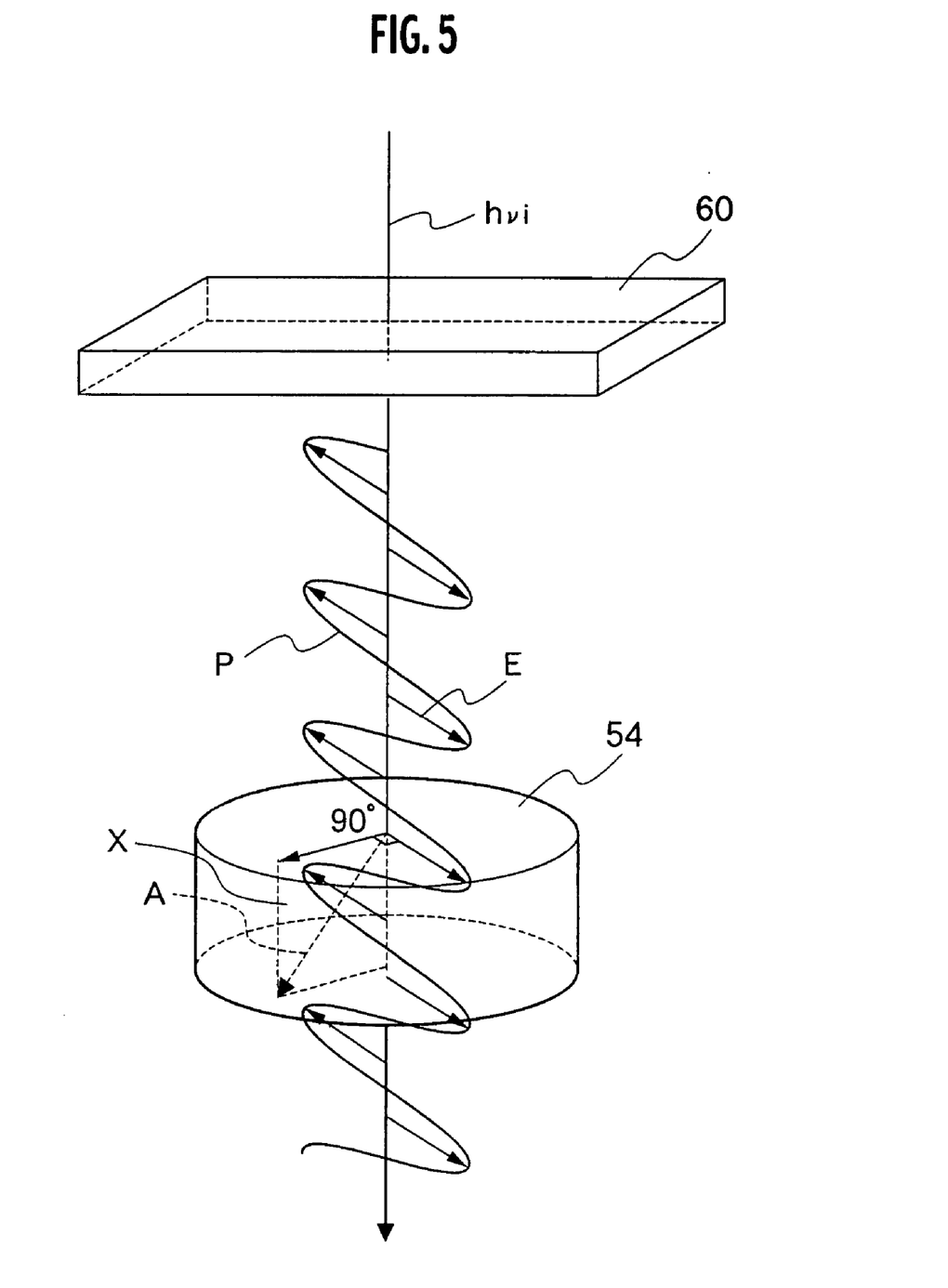
FIG. 5 is a second exploded perspective view of the polarizer and the monitor window in the optical system in accordance with the first embodiment of the present invention.

With reference next to FIG. 4 and FIG. 5, the optical relationship between the polarizer 60 and the monitor window 54 is depicted. The monitor window 54 is composed of a birefringent crystal such as sapphire, quarts, and calcite. In the birefringent crystal, there is one direction such that any light, regardless of the state of polarization of the light, has the same speed in that direction. Such direction is called the "optic axis". The direction adjuster 6 shown in FIG. 1 adjusts relative relationship between a polarization plane "P" of the inspection light h$\gamma_i$ and the direction of the optic axis "A". In FIG. 4, the monitor window 54 is oriented so that the optic axis "A" is substantially parallel with the polarization plane "P". In FIG. 5, a perpendicular plane "X" is substantially parallel to the propagation of the inspection light h$\gamma_i$ and is perpendicular to the polarization plane "P". Here, the monitor window 54 is oriented so that the optic axis "A" is substantially parallel with the perpendicular plane "X".

Figure 6:
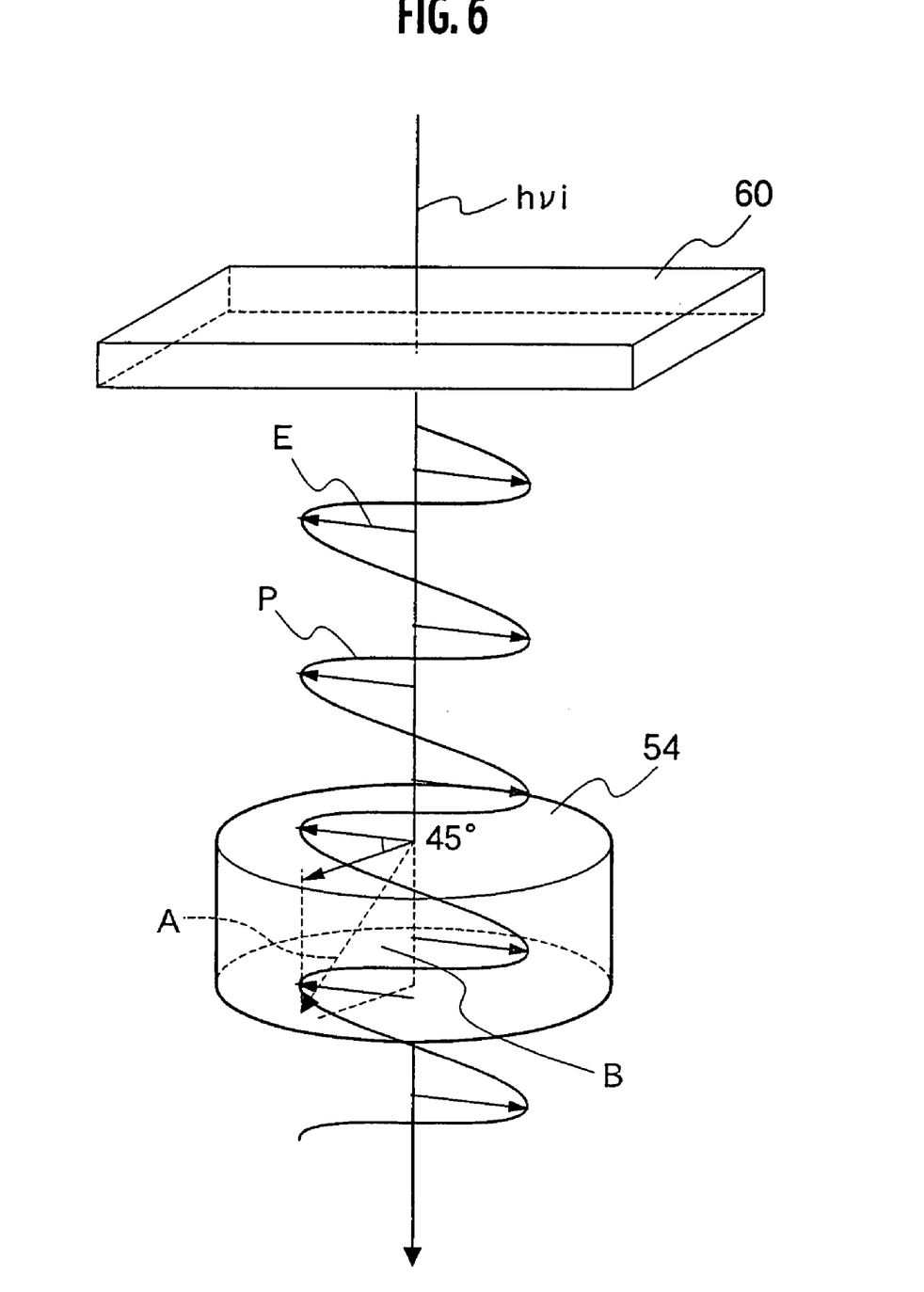
FIG. 6 is a third exploded perspective view of the polarizer and the monitor window in the optical system in accordance with the first embodiment of the present invention.

With reference next to FIG. 6, the monitor window 54 is oriented so that the optic axis "A" is substantially parallel with a plane "B" crossing the polarization plane "P" at an angle of 45 degree.

Figure 7:
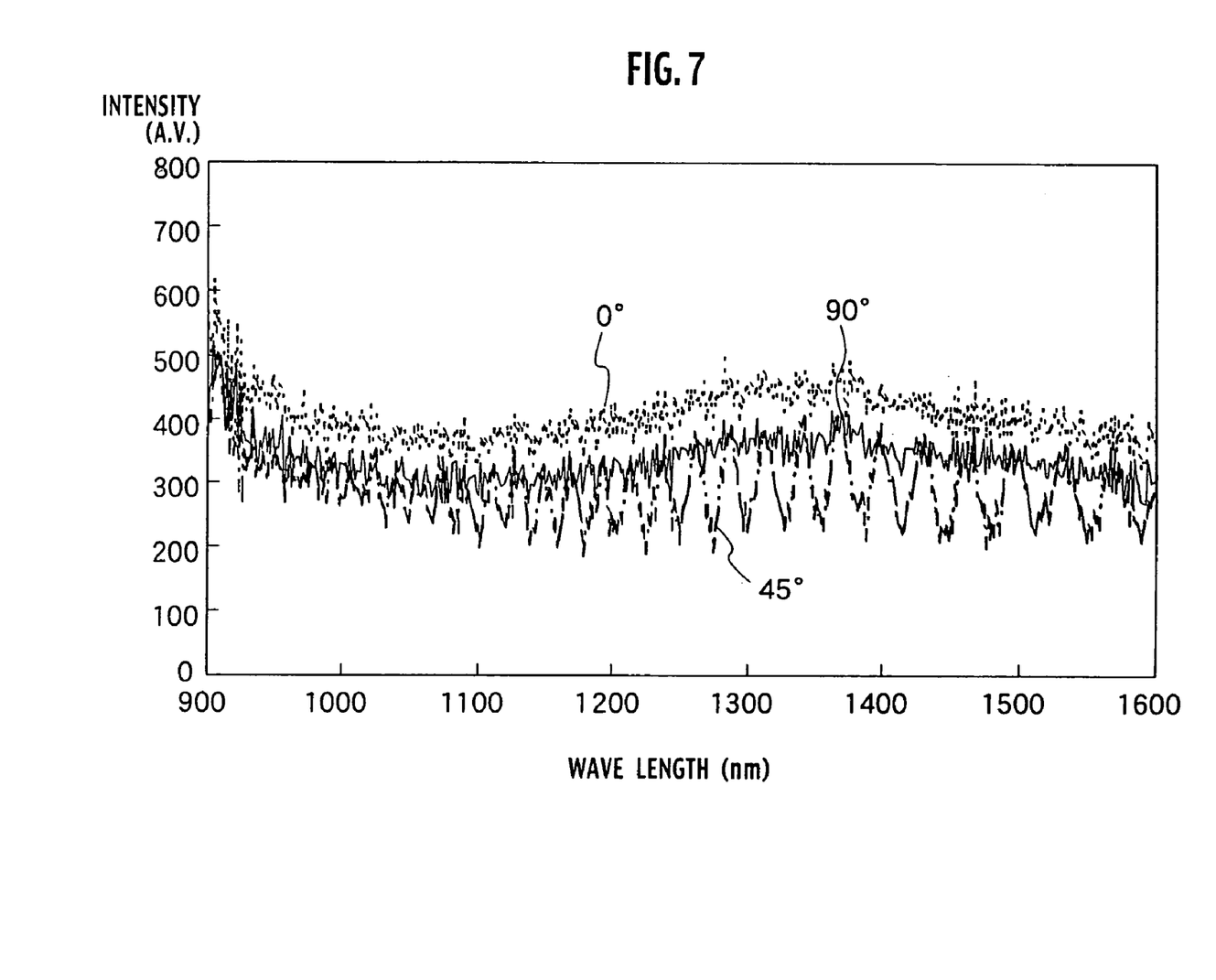
FIG. 7 is a sample graph of a spectrum of an inspection light in accordance with the first embodiment of the present invention.

FIG. 7 shows an example spectrum detected by the detector 24 shown in FIG. 1. As shown in FIG. 7, sawtooth pulses appear in the spectrum when the monitor window 54 is oriented so that the optic axis "A" is substantially parallel with the plane "B" crossing the polarization plane "P" at an angle of 45 degree as shown in FIG. 6. This is because the monitor window 54 composed of birefringent crystal interacts with the inspection light h$\gamma_i$ and modulates the phase of the light.

On the other hand, the sawtooth pulses disappear when the monitor window 54 is oriented so that the optic axis "A" is substantially parallel with the polarization plane "P" (0 degree) as shown in FIG. 4 or the optic axis "A" is substantially parallel with the polarization plane "P" (90 degree) as shown in FIG. 5.

It should be noted that it is permissible for the direction of the optic axis "A" shown in FIG. 4 to be slightly different from the parallel direction of the polarization direction "E". Also, it is permissible for the direction of the optic axis "A" shown in FIG. 5 to be slightly different from the parallel direction of the perpendicular plane. "X". If the differences are less than ±1 degree, the sawtooth pulses are effectively eliminated.

Figure 8:
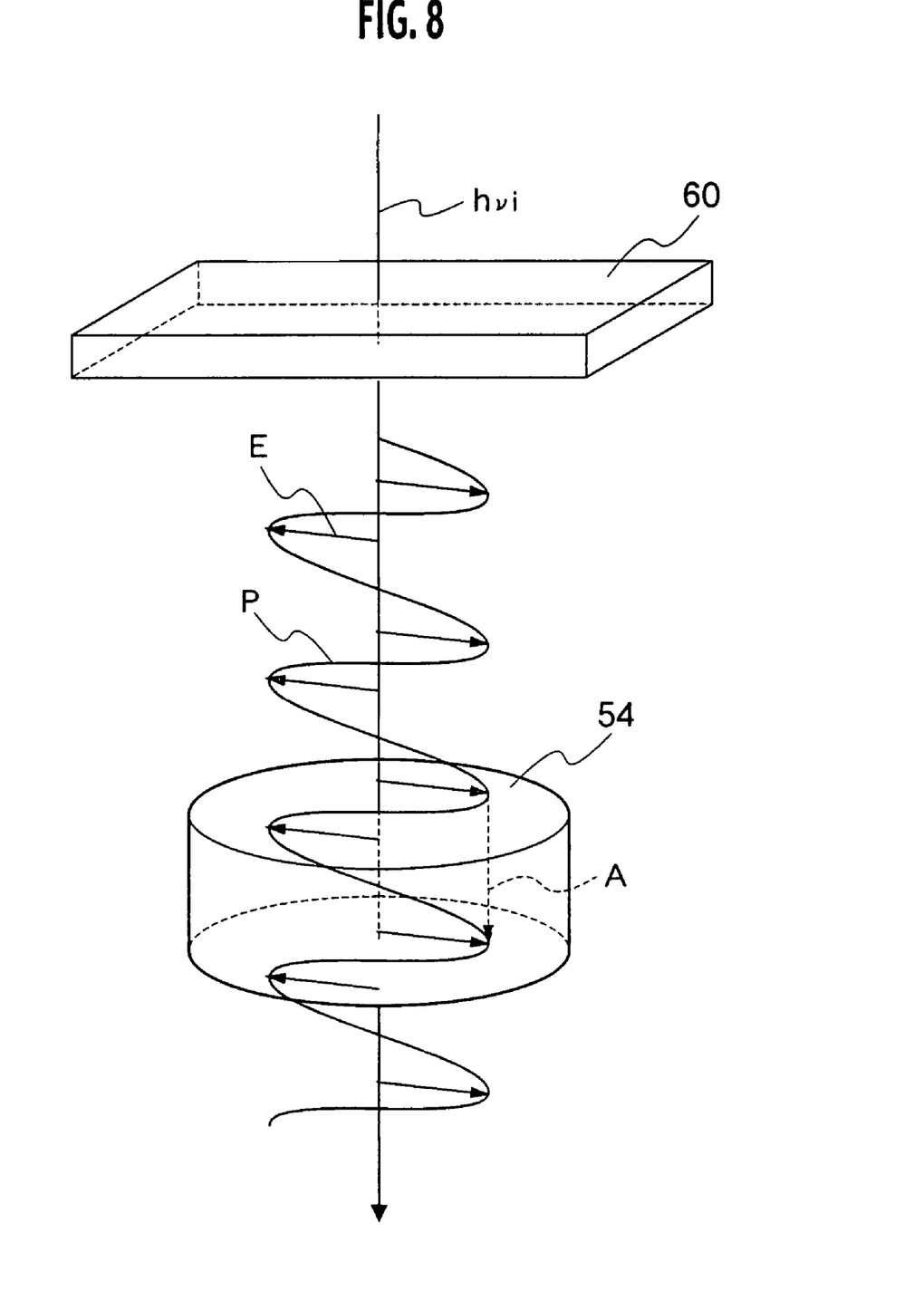
FIG. 8 is a fourth exploded perspective view of the polarizer and the monitor window in the optical system in accordance with the first embodiment of the present invention.

It is also possible to eliminate the sawtooth pulses with the monitor window 54 having the optic axis "A" substantially parallel with the propagation of the inspection light h$\gamma_i$ as shown in FIG. 8. The slight difference, such as ±1 degree, between the direction of the optic axis "A" and the propagation of the inspection light h$\gamma_i$ is permissible. In this case, the rotator 5 in the direction adjusting equipment 7 configured to adjust the orientation of the polarizer 60 may be solely controlled.

By adjusting the direction of the optic axis "A" in the monitor window 54 as shown in FIGS. 4, 5 and 8, the process monitoring system 10 makes it possible to eliminate the sawtooth pulses from the inspection light h$\gamma_i$ spectrum. In an earlier process monitoring system, the optical relationship between the polarizer and the monitor window composed of birefringent crystal was not important. Therefore, the sawtooth pulses appeared in the spectrum affected precise measurement. However, the process monitoring system 10 makes it possible to obtain precise information on the thickness direction of the object 16. Therefore, the process monitoring system 10 makes it possible to monitor the manufacturing process of fine and precise semiconductor devices.

Figure 9:
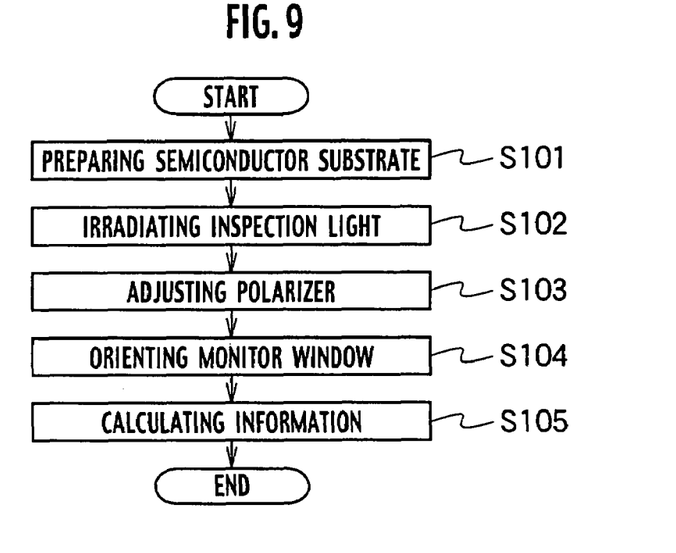
FIG. 9 is a flowchart depicting a process monitoring method in accordance with the first embodiment of the present invention.

With reference next to FIG. 9, a process monitoring method according to the first embodiment of the present invention is described.

In step S101, the object 16 such as the semiconductor substrate 80 covered with the second insulating film 83 and the resist masks 85a-85f shown in FIGS. 2 and 3 is disposed on the substrate holder 15 in the process chamber 50 of the plasma process.

In step S102, the illumination source 12 emits the inspection light h$\gamma_i$. The inspection light h$\gamma_i$ is propagated through the spatial filter 62, beam splitter 18, lens 14, polarizer 60, and the monitor window 54. Consequently, the object 16 is exposed to the inspection light h$\gamma_i$.

In step S103, the polarizer 60 shown in FIG. 1 is rotated by the rotator 5 so that the polarization direction "E" of the inspection light h$\gamma_i$ and the direction "D$_2$" shown in FIG. 3 are equivalent. Rotating the polarizer 60 by hand is an alternative.

In step S104, the direction adjuster 6 adjusts the orientation of the monitor window 54 in order to optimize the relationship between the polarization direction "E" of the linearly polarized inspection light h$\gamma_i$ and the optic axis "A" of the monitor window 5 as shown in FIGS. 4 and 5.

In step S105, the monitoring information processor 28 detects the reflected light h$\gamma_r$ propagated through the monitor window 54, the polarizer 60, the lens 14, the beam splitter 18, and the light fiber 20b. Thereafter, the monitoring information processor 28 analyzes the reflected light h$\gamma_r$ and calculates the thickness direction of the second insulating film 83 shown in FIGS. 2 and 3, based on the information received via the reflected light h$\gamma_r$.

Process monitoring methods of earlier technology generate the noises as the sawtooth pulses in the light spectrum. Such noise caused by the birefringence prevent precise measuring of the information on the thickness direction. However, the process monitoring method according to the first embodiment makes it possible to calculate accurate information on the thickness direction since the relationship between the polarization direction "E" and the optic axis A is optimized in step S104 in order to eliminate such noise.

Figure 10:
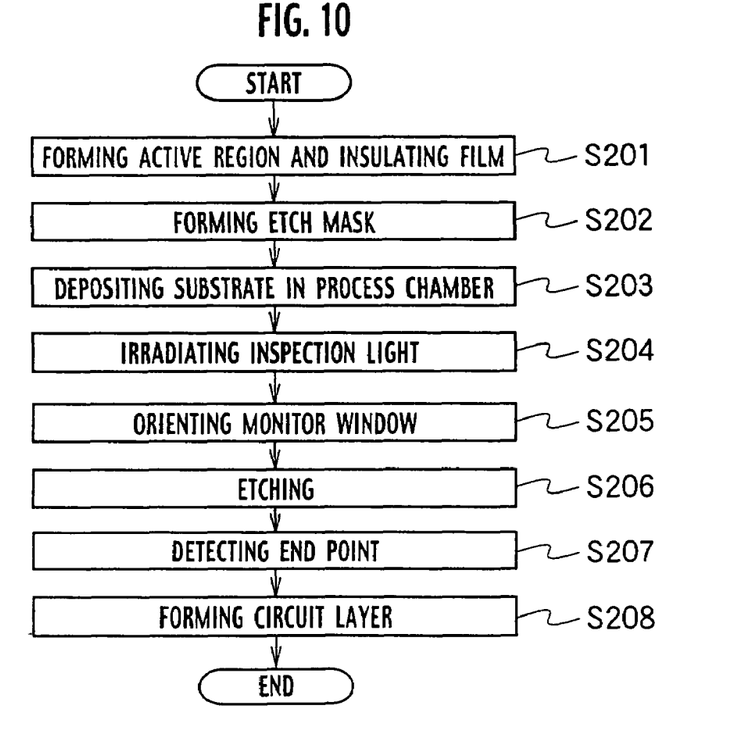
FIG. 10 is a flowchart depicting a method for manufacturing a semiconductor device in accordance with the first embodiment of the present invention.

With reference next to FIG. 10, a method for manufacturing the semiconductor device according to the first embodiment of the present invention is described.

Figure 11:
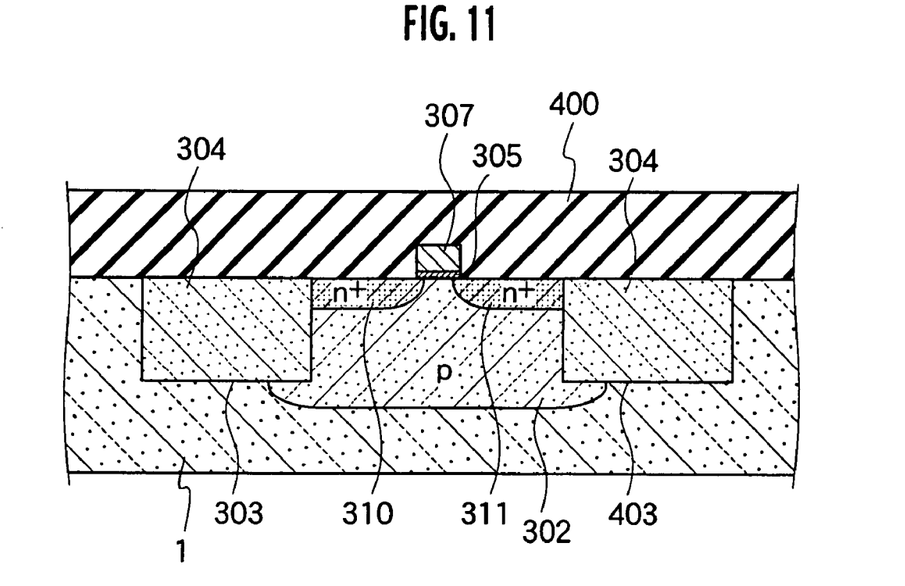
FIG. 11 is a first sectional view of the semiconductor device depicting the manufacturing process in accordance with the first embodiment of the present invention.

With reference to FIG. 11, boron is implanted into a semiconductor substrate 1 such as an n-type Si wafer in step S201. The semiconductor substrate 1 is then heated to diffuse the implanted boron and a p-well 302 is formed. The semiconductor substrate 1 is selectively etched and trenches 303, 403 are delineated. Thereafter, an isolation insulator 304 is deposited into the trenches 303, 403 by chemical vapor deposition (CVD). The semiconductor substrate 1 is oxidized to form a gate oxide film 305. A poly silicon gate 307 is deposited on the gate oxide film 305 by the CVD method and etching is performed. Then, self-aligned source/drain regions 310, 311 are formed by phosphorous ion implantation and annealing. Subsequently, an insulating film 400 is deposited by the CVD method.

Figure 12:
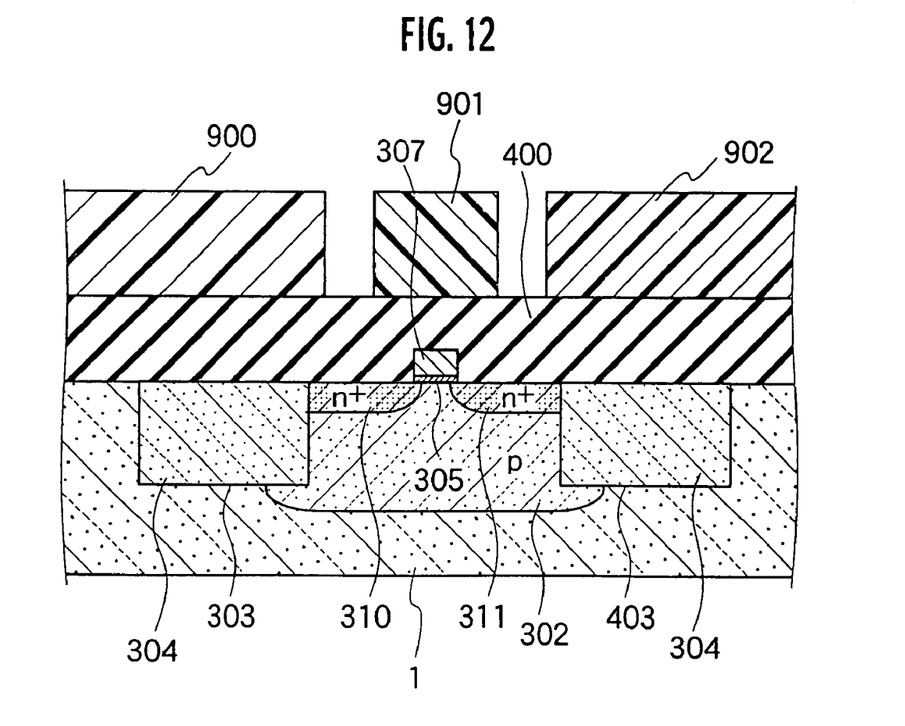
FIG. 12 is a second sectional view of the semiconductor device depicting the manufacturing process in accordance with the first embodiment of the present invention.
Figure 13:
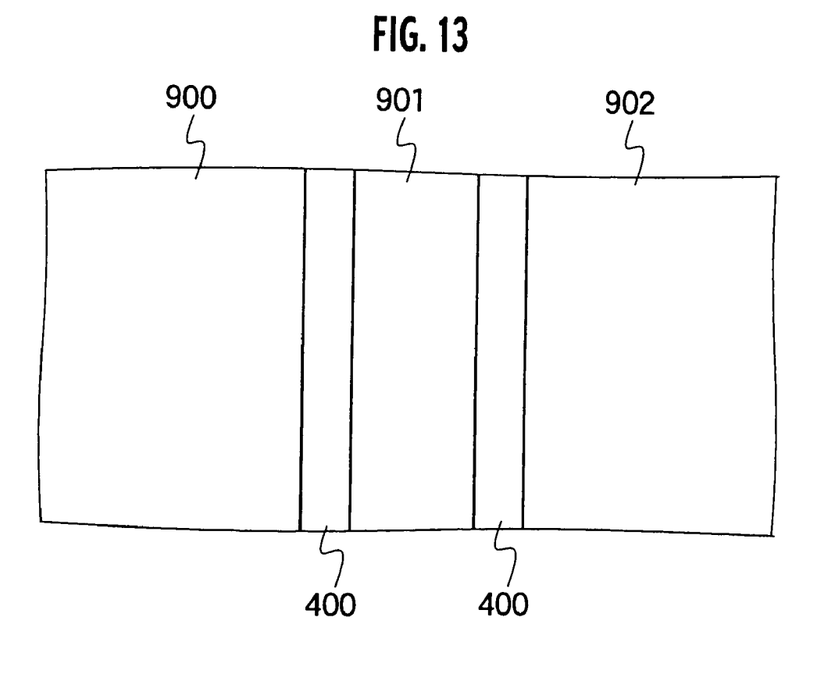
FIG. 13 is a plan view of the semiconductor device depicting the manufacturing process in accordance with the first embodiment of the present invention.

In step S202, etch masks 900, 901, 902 shown in FIGS. 12 and 13 are arranged on the insulating film 400 by lithography. In step S203, the semiconductor substrate 1 is inserted into the process chamber 50 of the plasma process shown in FIG. 1.

In step S204, the insulating film 400 is exposed to the polarized inspection light $h\gamma_i$. In step S205, the orientation of the monitor window 54 is adjusted by the direction adjuster 6 in order to optimize the relationship between the polarization direction "E" of the linearly polarized inspection light $h\gamma_i$ and the optic axis "A" of the monitor window 5 as shown in FIGS. 4 and 5.

In step S206, a reaction gas is introduced into the process chamber 50 of the plasma process after the pressure in the process chamber 50 of the plasma process is reduced. With AC power in the radio frequency (RF) range, a plasma glow discharge is generated to excite a reaction near the exposed surface of the insulating film 400. Consequently, the exposed portions of the insulating film 400 are selectively etched so as to form damascene grooves 800, 801.

Figure 14:
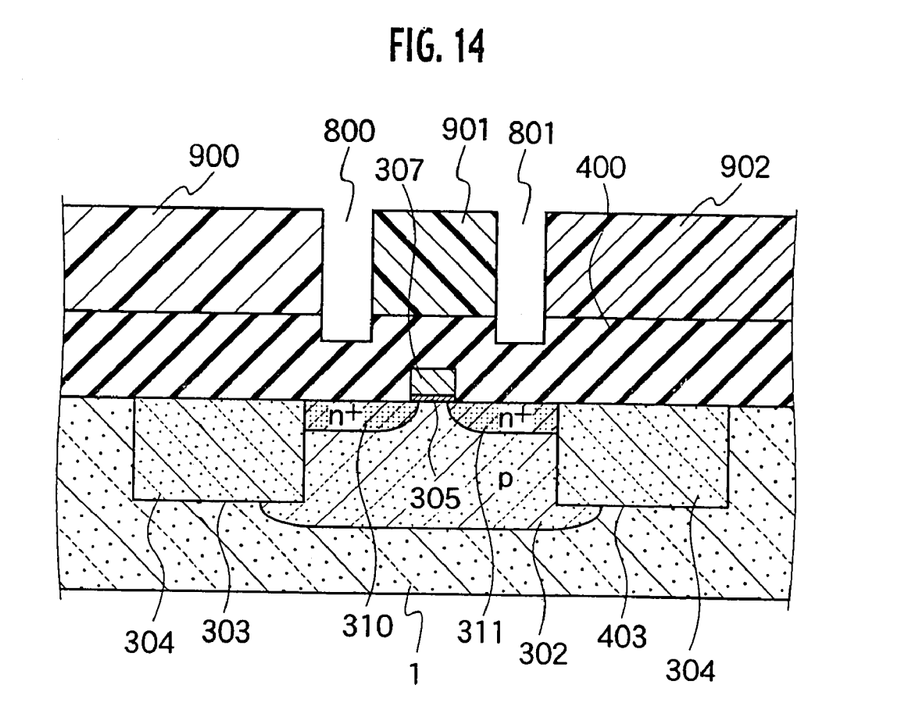
FIG. 14 is a third sectional view of the semiconductor device depicting the manufacturing process in accordance with the first embodiment of the present invention.

In step S207, the reflected light $h\gamma_r$ is propagated through the monitor window 54, beam splitter 18, and the light fiber 20b. The reflected light $h\gamma_r$ is detected by the monitoring information processor 28. When the monitoring information processor 28 detects the end point of damascene grooves 800, 801 shown in FIG. 14, the dry etch process is stopped.

In step S208, the semiconductor substrate 1 is removed from the process chamber 50 of the plasma process. Thereafter, via holes are provided in the insulating film 400 at the bottom of the damascene grooves 800, 801 and on the source/drain regions 310, 311 by a dry etching process. Then, the damascene grooves 800, 801 and the via holes are filled with copper, for example, by electroplating. After a chemical mechanical planarization process so as to implement damascus interconnections in the damascene grooves 800, 801, a circuit layer is formed. Thereafter, the insulating film formation and the circuit layer formation are repeated until the manufacturing of the semiconductor device is completed.

In earlier methods for manufacturing the semiconductor devices, noise appear in the spectrum of the inspection light. Such noise disturbs the accurate monitoring of the etch process and the deposition process. Therefore, problems such as short circuits may occur in the semiconductor devices.

However, in the method for manufacturing the semiconductor device according to the first embodiment, the relationship between the optic axis "A" and the polarization direction "E" is optimized as shown in FIGS. 4, 5, and 8. Therefore, such noise is eliminated in the spectrum, which allows the etch process and the deposition process to be monitored accurately. Further, it becomes possible to increase a yield rate in the manufacturing process for the semiconductor devise.

Second Embodiment

Figure 15:
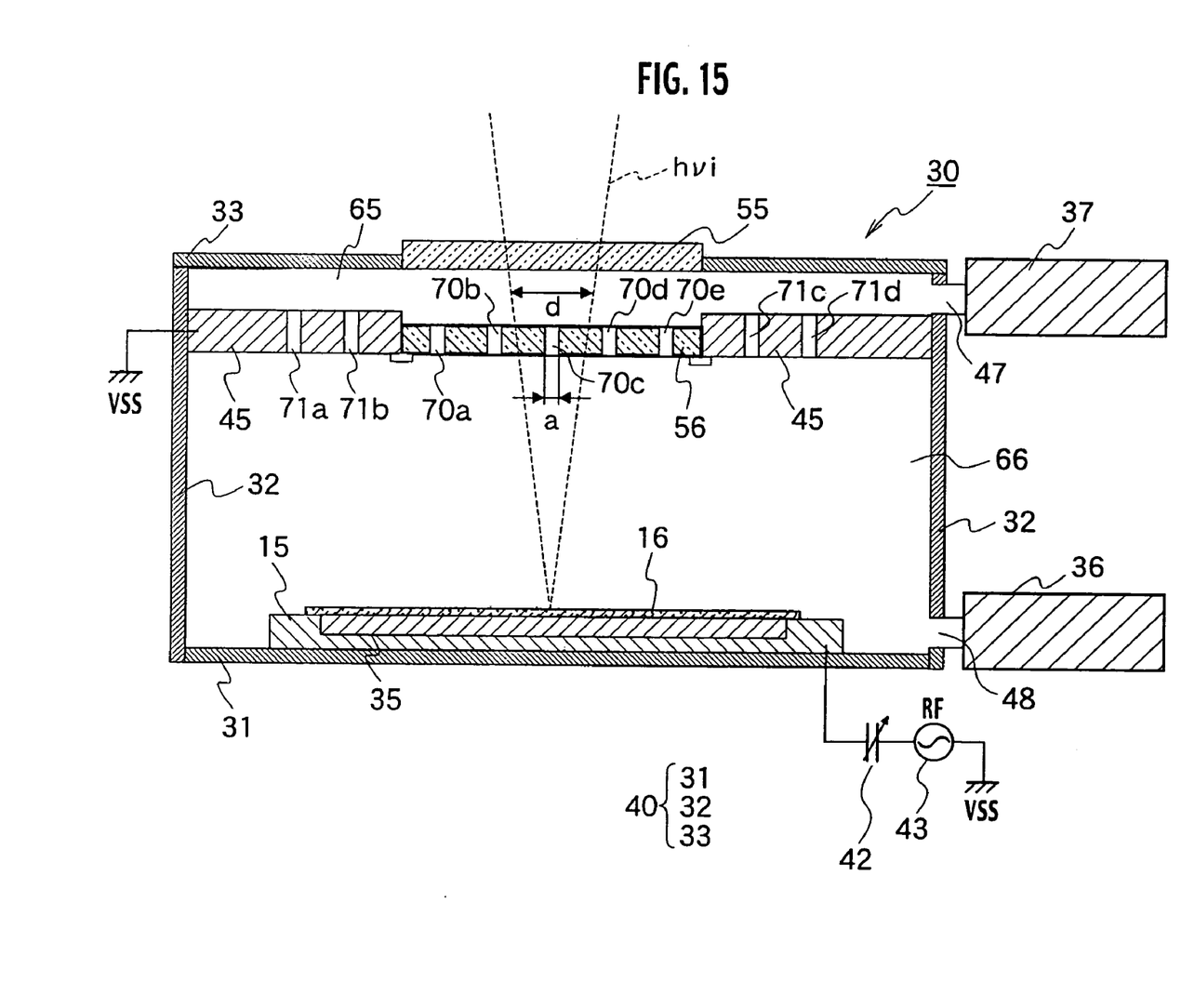
FIG. 15 is a diagram of a dry process apparatus in accordance with a second embodiment of the present invention.

With reference to FIG. 15, a dry process apparatus 30 has a process chamber 40 having a bottom portion 31, a lateral portion 32 disposed on the edge of the bottom portion 31, and a cap portion 33 disposed on the lateral portion 32.

Further, an upper electrode 45 for plasma process is disposed below the cap portion 33. The edge of the upper electrode 45 for the plasma process is attached to the lateral portion 32. A space surrounded by the bottom portion 31, the lateral portion 32, and the upper electrode 45 for the plasma process serves as a reaction space 66 of plasma process. A vacuum pump 36 is attached to the lateral portion 32 of the process chamber 40. A substrate holder 15 is disposed on the bottom portion 31. The substrate holder 15 serves as a lower electrode. A temperature controller 35 is embedded in the substrate holder 15. An object 16 to be processed is disposed on the substrate holder 15.

The space surrounded by the cap portion 33, the upper electrode 45 for the plasma process, and the lateral portion 32 comprises a gas head 65. A ceiling window 55 is provided in the cap portion 33. In a case where the ceiling window 55 is composed of the birefringent material, equipment similar to the direction adjuster 6 shown in FIG. 1 may be attached to the ceiling window 55.

Beneath the ceiling window 55, a monitor window 56 is provided in the upper electrode 45 for the plasma process. A gas supplier 37 is attached to the gas head 65 through an inlet port 47. The gas supplier 37 supplies the gas head 65 with a reaction gas. A plurality of gas holes 71a, 71b, 71c, 71d is formed in the upper electrode 45 for the plasma process. Further, a plurality of nozzle holes 70a, 70b, 70c, 70d, 70e, 70f, 70g, 70h, 70i, 70j, 70k, 70l, 70m, 70n, 70o, 70p, 70q, 70r, 70s, 70t, 70u, 70v, 70w, 70x, 70y is formed in the monitor window 56 as shown FIGS. 15 and 16. The reaction gas is supplied to the reaction space 66 of the plasma process shown in FIG. 15 from the gas head 65 via the gas holes 71a-71d and the nozzle holes 70a-70y.

The substrate holder 15 serving as the lower electrode is attached to an impedance matching device 42 for RF power. A variable capacitor may constitute the impedance matching device 42 of the RF power. The impedance matching device 42 is attached to a RF power supply 43. The impedance matching device 42 is used for matching electrical impedances between the RF power supply 43 and the substrate holder 15. On the other hand, the upper electrode 45 for the plasma process is grounded.

Disposed above the dry process apparatus 30 are the illumination source 12 and the lens 14, shown in FIG. 1. The monitoring information processor 28 detects the reflected light of the inspection light $h\gamma_i$ from the object 16.

With reference again to FIG. 15, each diameter "a" of the nozzle holes 70a-70y formed in the monitor window 65 is smaller than a laser diameter "d" of the inspection light $h\gamma_i$ at the monitor window 65. For example, the laser diameter "d" is 6-7 mm, and each diameter "a" of the nozzle holes 70a-70y is 1 mm. Since the inspection light $h\gamma_i$ is not focused at each of the nozzle holes 70a-70y, the inspection light $h\gamma_i$ is not scattered by the nozzle holes 70a-70y. Therefore, the nozzle holes 70a-70y do not affect spectrum obtained by the monitoring information processor 28 shown in FIG. 1.

Figure 16:
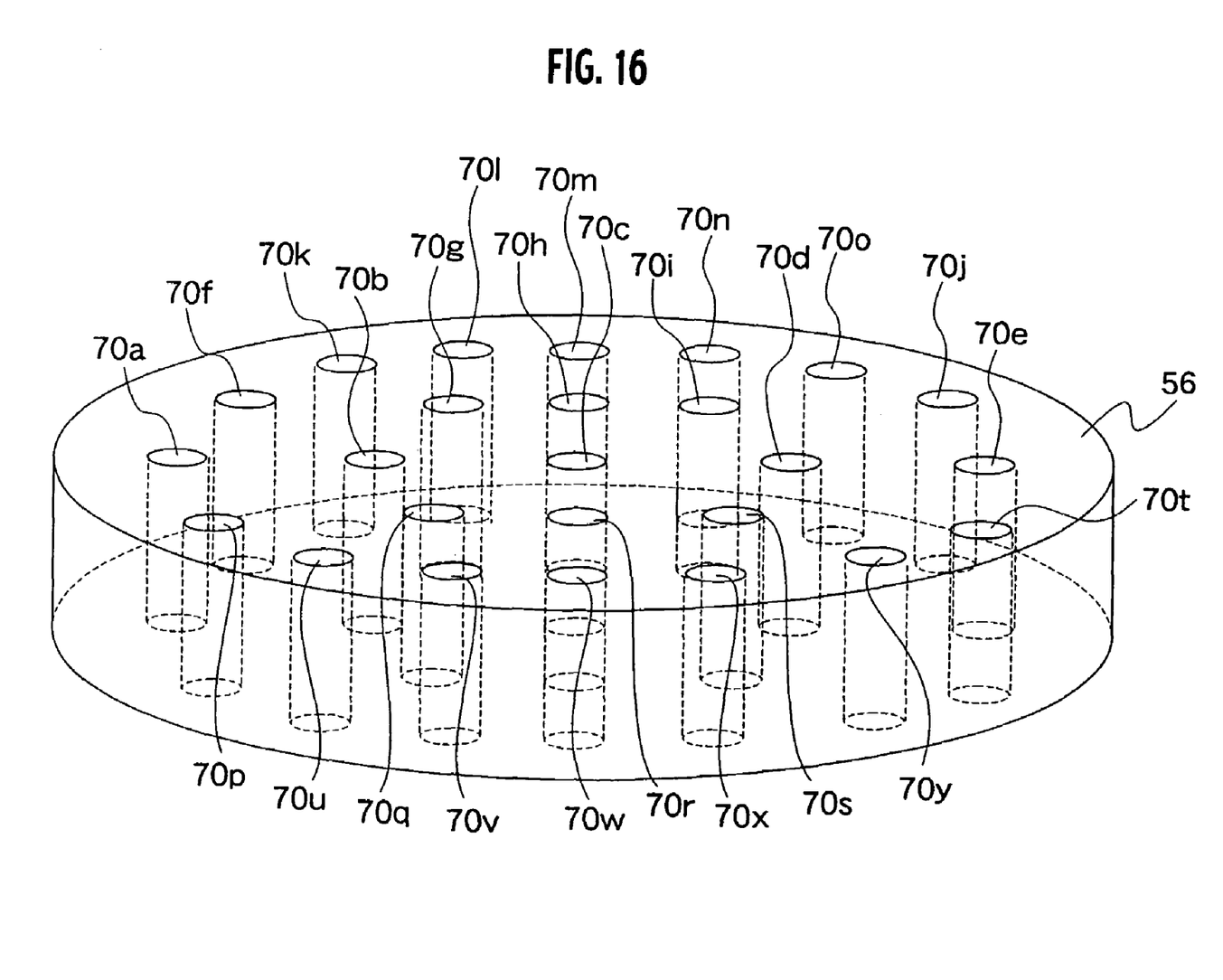
FIG. 16 is an exploded perspective view of a monitor window in accordance with the second embodiment of the present invention.

Such nozzle holes are not formed in a monitor window of the process monitoring system in earlier technology. Therefore, the reaction gas concentration beneath the monitor window becomes lower than in other space. Consequently, the etching rate beneath the monitor window is decelerated and the uniformity of the surface of the substrate is decreased. On the other hand, since the nozzle holes 70a-70y are formed in the monitor window 56 as shown in FIG. 16, the reaction gas concentration beneath the monitor window 56 remains the same as other regions. Therefore, both etching rate beneath the monitor window 56 and of other area on the surface of the object 16 are equivalent, since the nozzle holes 70a-70y formed in the monitor window 56 is opposed to the object 16. Consequently, the evenness of the etching rate on the object 16 is increased and the precision of the end point monitoring is also increased.

An amorphous material such as glass may be used for the monitor window 56 according to the second embodiment of the present invention. Also, birefringent crystals such as sapphire, quarts, and calcite are available for the monitor window 56.

Figure 17:
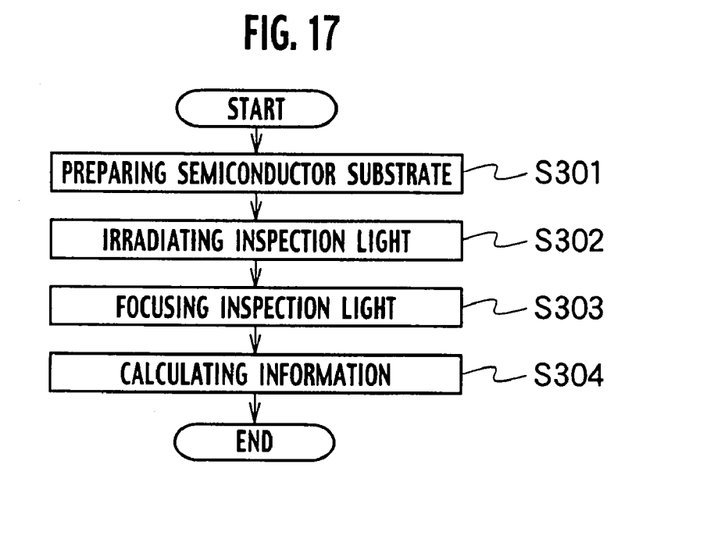
FIG. 17 is a flowchart depicting a process monitoring method in accordance with the second embodiment of the present invention.

With reference next to FIG. 17, a process monitoring method according to the second embodiment of the present invention is described.

In step S301, the object 16 to be processed is disposed on the substrate holder 15 of the dry process apparatus 30 as shown in FIG. 15. In this case, the object 16 is opposed to the nozzle holes 70a-70y formed in the monitor window 56.

In step S302, the inspection light $h\gamma_i$ is emitted to the object 16 from the illumination source 12. In step S303, the focus of the inspection light $h\gamma_i$ is adjusted by the lens 14 so that the beam diameter "d" at the monitor window 56 becomes larger than the nozzle hole diameter "a" shown in FIGS. 15 and 16.

In step S304, the detector 24 of the monitoring information processor 28 detects the reflected light $h\gamma_r$ spectrum from the object 16. Based on the spectrum, the calculator 26 determines information on the thickness direction of the object 16

Figure 18:
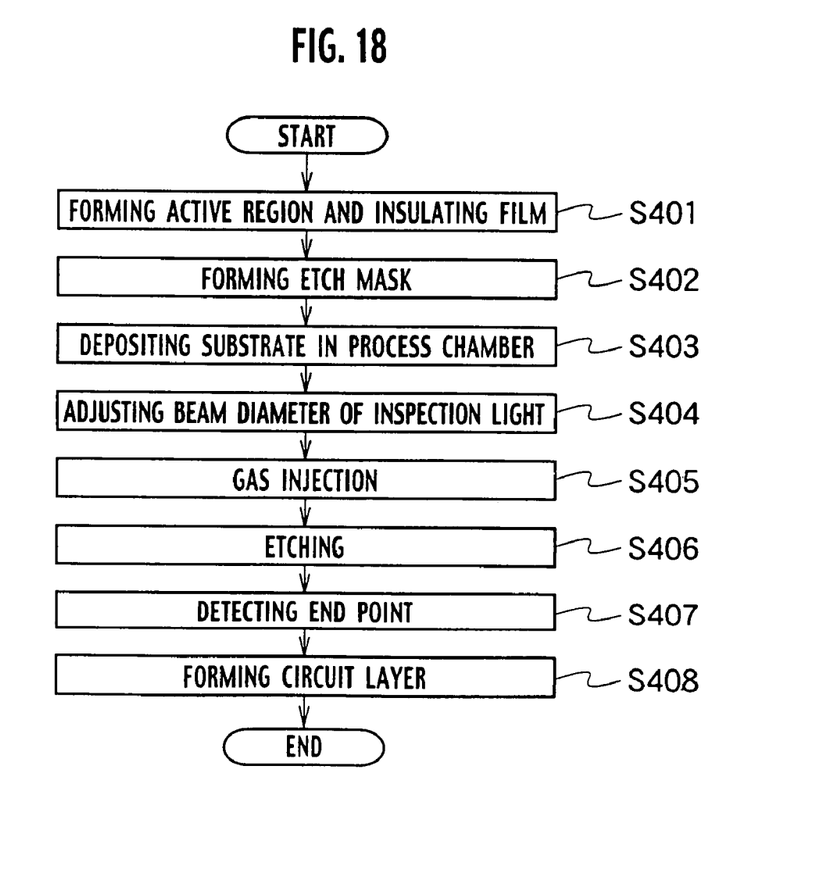
FIG. 18 is a flowchart depicting a method for manufacturing a semiconductor device in accordance with the second embodiment of the present invention.

With reference next to FIG. 18, a method for manufacturing a semiconductor device according to the second embodiment of the present invention is described.

Steps S401 and S402 are similar to the steps S201 and S202 shown in FIG. 10. In step S403, the semiconductor substrate 1 shown in FIG. 12 is disposed on the substrate holder 15 in the process chamber 40 shown in FIG. 15. In this case, the semiconductor substrate 1 is opposed to the nozzle holes 70a-70y formed in the monitor window 56.

In step S404, the inspection light $h\gamma_i$ propagates through the monitor window 56 and the insulating film 400 shown in FIG. 12 is exposed to the polarized inspection light $h\gamma_i$. Thereafter, the focus of the inspection light $h\gamma_i$ is adjusted by the lens 14 so that the beam diameter "d" at the monitor window 56 becomes larger than the nozzle hole diameter "a" shown in FIGS. 15 and 16.

In step S405, the pressure of the process chamber 40 is reduced with the vacuum pump 36. Thereafter, the reaction gas is supplied to the interior of the process chamber 40 through the nozzle holes 70a-70y of the monitor window 56 and the gas holes 71a-71d of the upper electrode 45 for the plasma process.

In step S406, the RF power is applied to the substrate holder 15. Consequently, a plasma glow discharge is generated and the insulating film 400 exposed from the etch masks 900-902 shown in FIGS. 12 and 13 is selectively etched by the gas reaction.

In step S407, the reflected light $h\gamma_r$ from the surface of the insulating film 400 is detected by the monitoring information processor 28 shown in FIG. 1. When the monitoring information processor 28 detects the end point of damascene grooves 800, 801 shown in FIG. 14, the dry etch process is stopped.

In step S408, the semiconductor substrate 1 is removed from the process chamber 50 of the plasma process. Thereafter, via holes are provided in the insulating film 400 at the bottom of the damascene grooves 800, 801 and on the source/drain regions 310, 311 by the dry etching process.

Then, the damascene grooves 800, 801 and the via holes are filled with copper, for example, by electroplating. After a chemical mechanical planarization process so as to implement damascus interconnections in the damascene grooves 800, 801, a circuit layer is formed. Thereafter, the insulating film formation and the circuit layer formation are repeated until the manufacturing of the semiconductor device is completed.

According to the process monitoring method shown in FIG. 17 and the method for manufacturing the semiconductor device shown in FIG. 18, the inspection light $h\gamma_i$ is not scattered by the nozzle holes 70a-70e shown in FIG. 15 and it is possible to supply sufficient reaction gas even under the monitor window 56. Therefore, it is possible to maintain the uniformity of the gas reaction on the substrate surface in the dry process apparatus 30.

OTHER EMBODIMENTS

Although the invention has been described above by reference to the embodiment of the present invention, the present invention is not limited to the embodiment described above. Modifications and variations of the embodiment described above will occur to those skilled in the art, in the light of the above teachings.

For example, the method for manufacturing the semiconductor according to the embodiment is applied to manufacturing transistors as in above description. Furthermore, it is possible to apply the method according to the embodiment to manufacturing other active components such as diodes.

In FIG. 15, the substrate holder 15 serving as the lower electrode holds the object 16. However, it is also possible to apply the process monitoring method according to the embodiment to downstream plasma etching systems. Further, it is possible to apply the process monitoring method according to the embodiment to chemical etching systems using barrel reactors. Also, it is possible to apply dry processes other than the plasma process such as a gas etching, a photo-excited etching, a high temperature CVD, and a photo-excited CVD. Furthermore, it is possible to apply the process monitoring method according to the embodiment to various apparatuses requiring information on a thickness direction of a film, such as chemical mechanical planarization systems.

As described above, the present invention includes many variations of embodiments. Therefore, the scope of the invention is defined with reference to the following claims.

What is claimed is:

1. A process monitoring method comprising:
   inserting an object to be processed into a process chamber, the process chamber having a monitor window containing a birefringent material;
   irradiating a light to the object through the monitor window;
   polarizing the light;
   adjusting a relationship between a polarization plane of the light and a direction of an optic axis of the monitor window;
   detecting the light reflected from the object; and
   obtaining information about a thickness direction of the object, based on the detected light.

2. The method of claim 1, wherein adjusting the relationship makes the direction of the optic axis substantially parallel with the polarization plane.

3. The method of claim 1, wherein adjusting the relationship makes the direction of the optic axis substantially parallel with a perpendicular plane that is parallel to propagation of the light and is perpendicular to the polarization plane.

4. The method of claim 1, wherein adjusting the relationship makes the direction of the optic axis substantially parallel with propagation of the light.

* * * * *